United States Patent
Abou-Khalil et al.

(10) Patent No.: US 7,786,535 B2
(45) Date of Patent: Aug. 31, 2010

(54) DESIGN STRUCTURES FOR HIGH-VOLTAGE INTEGRATED CIRCUITS

(75) Inventors: Michel J. Abou-Khalil, Essex Junction, VT (US); Robert J. Gauthier, Jr., Hinesburg, VT (US); Tom C. Lee, Essex Junction, VT (US); Junjun Li, Williston, VT (US); Christopher S. Putnam, Hinesburg, VT (US); Souvick Mitra, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 12/059,034

(22) Filed: Mar. 31, 2008

(65) Prior Publication Data

US 2009/0179268 A1 Jul. 16, 2009

Related U.S. Application Data

(63) Continuation-in-part of application No. 12/013,101, filed on Jan. 11, 2008.

(51) Int. Cl.
*H01L 29/78* (2006.01)
(52) U.S. Cl. ............... 257/365; 257/348; 257/E27.112; 257/E29.04
(58) Field of Classification Search ............. 257/348, 257/365, E27.112, E29.04
See application file for complete search history.

(56) References Cited

U.S. PATENT DOCUMENTS

| | | | |
|---|---|---|---|
| 4,619,033 A | 10/1986 | Jastrzebski | |
| 5,416,041 A | 5/1995 | Schwalke | |
| 5,494,837 A | 2/1996 | Subramanian et al. | |
| 5,496,765 A | 3/1996 | Schwalke | |
| 5,637,898 A | 6/1997 | Baliga | |
| 5,689,127 A | 11/1997 | Chu et al. | |
| 5,700,712 A | 12/1997 | Schwalke | |
| 5,726,094 A | 3/1998 | Schwalke et al. | |
| 6,121,651 A | 9/2000 | Furukawa et al. | |
| 6,140,684 A | 10/2000 | Chan et al. | |
| 6,191,447 B1 | 2/2001 | Baliga | |
| 6,228,745 B1 | 5/2001 | Wheeler et al. | |
| 6,313,482 B1 | 11/2001 | Baliga | |
| 6,323,082 B1 | 11/2001 | Furukawa et al. | |
| 6,365,462 B2 | 4/2002 | Baliga | |
| 6,483,156 B1 | 11/2002 | Adkisson et al. | |

(Continued)

OTHER PUBLICATIONS

USPTO, Office Action issued in related U.S. Appl. No. 12/013,101 dated Feb. 2, 2010.

(Continued)

*Primary Examiner*—Allan R. Wilson
(74) *Attorney, Agent, or Firm*—Wood, Herron & Evans, LLP

(57) ABSTRACT

Design structures for high-voltage integrated circuits. The design structure, which is formed using a semiconductor-on-insulator (SOI) substrate, may include device structure with a semiconductor body positioned between first and second gate electrodes. The first and second gate electrodes and the semiconductor body may be formed from the monocrystalline SOI layer of the SOI substrate. A dielectric layer separates each of the first and second gate electrodes from the semiconductor body. These dielectric layers are formed by defining trenches in the SOI layer and filling the trenches with a dielectric material, which may occur concurrently with a process forming other device isolation regions.

14 Claims, 6 Drawing Sheets

U.S. PATENT DOCUMENTS

| | | | |
|---|---|---|---|
| 6,580,137 | B2 | 6/2003 | Parke |
| 6,583,469 | B1 | 6/2003 | Fried et al. |
| 6,624,459 | B1 | 9/2003 | Dachtera et al. |
| 6,635,544 | B2 | 10/2003 | Disney |
| 6,657,252 | B2 * | 12/2003 | Fried et al. ............... 257/316 |
| 6,750,105 | B2 | 6/2004 | Disney |
| 6,764,889 | B2 | 7/2004 | Baliga |
| 6,815,282 | B2 | 11/2004 | Dachtera et al. |
| 6,949,768 | B1 | 9/2005 | Anderson et al. |
| 6,960,507 | B2 | 11/2005 | Kim et al. |
| 7,019,342 | B2 | 3/2006 | Hackler, Sr. et al. |
| 7,052,958 | B1 * | 5/2006 | Fried et al. ............... 438/257 |
| 7,078,296 | B2 | 7/2006 | Chau et al. |
| 7,122,449 | B2 | 10/2006 | Langdo et al. |
| 7,132,751 | B2 | 11/2006 | Chang |
| 7,148,526 | B1 | 12/2006 | An et al. |
| 7,217,603 | B2 | 5/2007 | Currie et al. |
| 7,235,439 | B2 | 6/2007 | Udrea et al. |
| 7,256,142 | B2 | 8/2007 | Fitzgerald |
| 7,262,462 | B2 | 8/2007 | Kim et al. |
| 7,462,905 | B2 | 12/2008 | Imai et al. |
| 2003/0178670 | A1 * | 9/2003 | Fried et al. ............... 257/315 |
| 2003/0218198 | A1 | 11/2003 | Dachtera et al. |
| 2005/0017289 | A1 | 1/2005 | Kim et al. |
| 2005/0242368 | A1 | 11/2005 | Udrea et al. |
| 2005/0242369 | A1 | 11/2005 | Udrea et al. |
| 2006/0027869 | A1 | 2/2006 | Kim et al. |
| 2006/0084212 | A1 | 4/2006 | Anderson et al. |
| 2007/0109836 | A1 | 5/2007 | Lung |
| 2008/0286978 | A1 | 11/2008 | Chen et al. |
| 2009/0179268 | A1 | 7/2009 | Abou-Khalil et al. |
| 2009/0179269 | A1 | 7/2009 | Hook et al. |

OTHER PUBLICATIONS

Ahn, et al., Comparison of Performance and Reliability Between MOSFET's with LPCVD Gate Oxide and Thermal Gate Oxide, IEEE Transactions on Electron Devices, vol. 38, No. 12, Dec. 1991 (2 pages).

Ahn, et al., "Electrical Properties of MOSFET's with N2O-Nitrided LPCVD SiO2 Gate Dielectrics", IEEE Electron Device Letters, vol. 13, No. 9, Sep. 1992 (3 pages).

Lee, et al., "Statistical Modeling of Silicon Dioxide Reliability", IEEE Reliability Physics Symposium, 26th Annual Proceedings, 1998, pp. 131-138.

Lee, et al., "Modeling and Characteriziation of Gate Oxide Reliability", IEEE Transactions on Electron Devices, vol. 35, No. 12, Dec. 1998, pp. 2268-2278.

USPTO, Office Action issued in related U.S. Appl. No. 11/972,949 dated Aug. 21, 2009.

USPTO, Office Action issued in related U.S. Appl. No. 11/972,941 dated Jan. 8, 2010.

USPTO, Notice of Allowance issued in related U.S. Appl. No. 12/013,101 dated Mar. 31, 2010.

USPTO, Office Action issued in related U.S. Appl. No. 11/972,949 dated Mar. 5, 2010.

USPTO, Notice of Allowance issued in related U.S. Appl. No. 11/972,941 dated Apr. 19, 2010.

* cited by examiner

US 7,786,535 B2

DESIGN STRUCTURES FOR HIGH-VOLTAGE INTEGRATED CIRCUITS

CROSS-REFERENCE TO RELATED APPLICATIONS

This application is a continuation-in-part of application Ser. No. 12/013,101, filed Jan. 11, 2008, the disclosure of which is hereby incorporated by reference herein in its entirety.

FIELD OF THE INVENTION

The invention relates generally to semiconductor device fabrication and, in particular, to design structures for high voltage integrated circuits.

BACKGROUND OF THE INVENTION

Complementary metal-oxide-semiconductor (CMOS) technology is used in microprocessors, static random access memories, and other diverse types of digital logic integrated circuits and analog integrated circuits. Conventional device structures for a planar field effect transistor (FET) fabricated using CMOS technology include a semiconductor layer, a source and a drain defined in the semiconductor layer, a channel defined in the semiconductor layer between the source and drain, and a control gate electrode. The material constituting the gate electrode in such conventional planar device structures contains polycrystalline silicon (polysilicon) or a metal applied by an additive process that involves blanket deposition of the material and patterning with a conventional lithography and etching process. When a control voltage exceeding a characteristic threshold voltage is applied to the control gate electrode, an depletion and then inversion layer is formed in the channel by the resultant electric field and carrier flow occurs in the inversion layer between the source and drain (i.e., the device output current).

In certain CMOS designs, low-voltage MOSFETs and high-voltage MOSFETs and junction field effect transistors (JFETs) are fabricated as a unitary integrated circuit. The former device type may be used for logic functions. The latter device type may be used for analog functions, such as radiofrequency switches and power amplifiers. This single chip implementation may be accomplished by reliance on thin gate oxide layers for the low-voltage MOSFETs and thicker gate oxide layers for high-voltage MOSFETs and JFETs. The thicker gate oxide layers are required because the high-voltage MOSFETs and JFETs operate at control voltages exceeding 10 volts, which is significantly higher than the low-voltage logic MOSFETs. Thick gate oxides may be difficult to perfect in high-performance CMOS because of the relatively small thickness of the SOI layer. Moreover, integration of both low-voltage MOSFET devices and high-voltage MOSFET or JFET devices in a single integrated circuit in conventional CMOS fabrication schemes may require a relatively large number of fabrication steps and a large number of different masks as the devices are concurrently fabricated.

Consequently, design structures are needed for high voltage integrated circuits that include high-voltage MOSFETs and JFETs that overcome these and other deficiencies of conventional design structures.

SUMMARY OF THE INVENTION

In one embodiment, a design structure is provided that is embodied in a machine readable medium for designing, manufacturing, or testing an integrated circuit. The design structure includes a first gate electrode, a second gate electrode, and a semiconductor body with a source, a drain, and a channel between the source and the drain. The semiconductor body is positioned laterally on the insulating layer between the first gate electrode and the second gate electrode. A first dielectric layer is disposed between the semiconductor body and the first gate electrode and a second dielectric layer is disposed between the semiconductor body and the second gate electrode. The semiconductor body, the first gate electrode, the second gate electrode, the first dielectric layer, and the second dielectric layer each have a contacting relationship with the insulating layer. The device structure may be included in a design structure. The design structure may comprise a netlist and may reside on storage medium as a data format used for the exchange of layout data of integrated circuits. The design structure may reside in a programmable gate array.

DETAILED DESCRIPTION

Figure 1A:
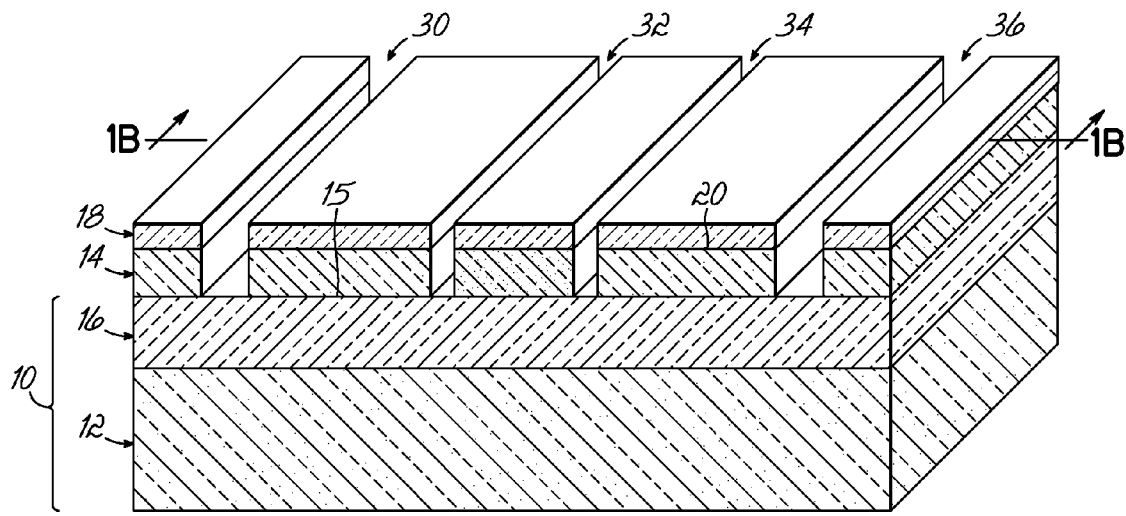
FIG. 1A is a diagrammatic view of a device structure built on a portion of a semiconductor-on-insulator substrate at an initial fabrication stage of a processing method in accordance with an embodiment of the invention.
Figure 1B:
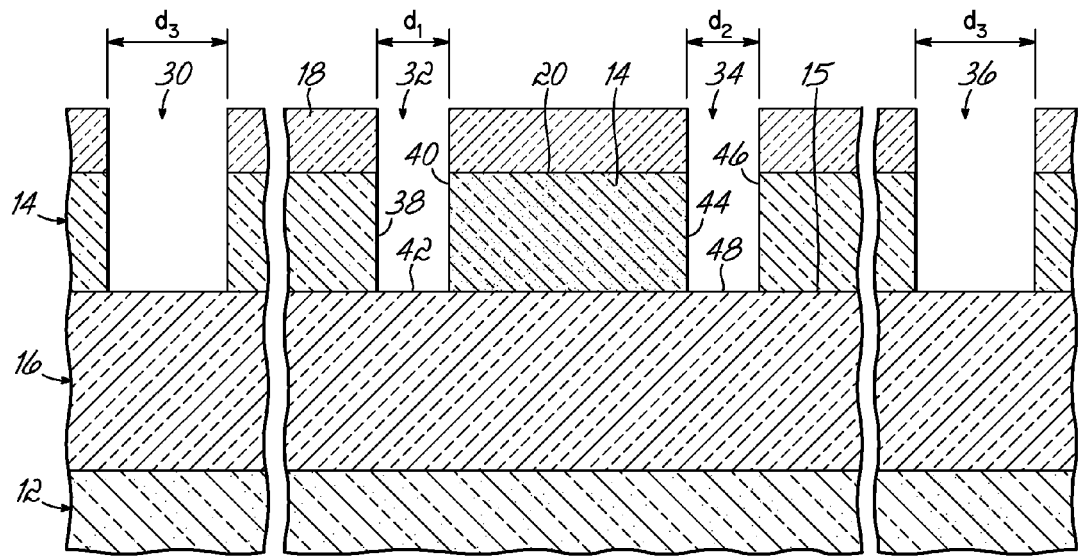
FIG. 1B is a diagrammatic cross-sectional view taken generally along line 1B-1B in FIG. 1A.

With reference to FIGS. 1A and 1B and in accordance with an embodiment of the invention, a semiconductor-on-insulator (SOI) substrate 10 includes a handle wafer 12, an active semiconductor or SOI layer 14, and a buried insulating layer 16 formed of an insulating material. The buried insulating layer 16 may be a buried oxide layer containing silicon dioxide (e.g., $SiO_2$). The SOI layer 14 is separated from the handle wafer 12 by the intervening buried insulating layer 16. The SOI layer 14 is composed of single crystal or monocrystalline semiconductor material, such as silicon or a material that primarily contains silicon. The monocrystalline semiconductor material of the SOI layer 14 may contain a definite defect concentration and still be considered single crystal. The handle wafer 12 may also be constituted by a single crystal or monocrystalline semiconductor material, such as silicon, or another type of material. The buried insulating layer 16 electrically isolates the handle wafer 12 from the SOI layer 14, which is considerably thinner than the handle wafer 12 and is in direct contact with a top surface 15 of the buried insulating layer 16.

A pad layer 18 is formed on a top surface 20 of the SOI layer 14. The pad layer 18 is composed of a material that operates as a hardmask that etches selectively to the semiconductor material constituting the SOI layer 14 and that functions as a polish stop layer and reactive ion etch mask during subsequent fabrication stages. In one embodiment, the pad layer 18 may be $SiO_2$ deposited by a thermal chemical vapor deposition (CVD) process or $SiO_2$ grown by oxidizing a thin surface thickness of the SOI layer 14.

Dielectric layers or regions, of which dielectric regions 24, 26 (FIG. 2) are representative, and isolation regions, of which isolation regions 22, 28 are representative, are defined in the SOI layer 14. These dielectric regions 24, 26 and isolation regions 22, 28 (FIG. 2) may be formed by, for example, a shallow trench isolation (STI) technique that relies on a conventional lithography and dry etching process to define a series of substantially parallel trenches 30, 32, 34, 36 and then fills the trenches 30, 32, 34, 36 with portions of a dielectric material to define the dielectric regions 24, 26 and isolation regions 22, 28.

The lithography process entails applying a resist (not shown) on pad layer 18, exposing the resist to a pattern of radiation to create a latent pattern in the resist for the trenches 30, 32, 34, 36, and developing the transferred pattern in the exposed resist. The pattern is transferred from the resist to the SOI layer 14 by a series of anisotropic dry etches, such as reactive-ion etching (RIE) or a plasma etching process, that patterns the pad layer 18 using the patterned resist as an etch mask and then defines the trenches 30, 32, 34, 36 in the SOI layer 14 using the patterned pad layer 18 as an etch mask. The etching process may be conducted in a single etching step or multiple etching steps with different etch chemistries, including a standard silicon RIE process for the SOI layer 14. The etching process removes the constituent material of the SOI layer 14 selective (i.e., at a significantly higher etch rate) to the material constituting the pad layer 18 to define trenches 30, 32, 34, 36 in the SOI layer 14 and stops on the top surface 15 of the buried insulating layer 16. After etching is concluded, residual resist is stripped by, for example, plasma ashing or a chemical stripper.

Each of the trenches 30, 32, 34, 36 defines a window extending completely through the thickness of SOI layer 14 and exposes a respective surface area of the top surface 15 of buried insulating layer 16. Trench 32 includes opposite sidewalls 38, 40 that extend through SOI layer 14 to intersect the buried insulating layer 16 across a base 42. Sidewalls 38, 40 are oriented substantially perpendicular to the top surface 20 of SOI layer 14 and are contained in substantially parallel planes. Similarly, trench 34 includes opposite sidewalls 44, 46 that extend through SOI layer 14 to intersect the buried insulating layer 16 across a base 48. Sidewalls 44, 46 are contained in substantially parallel planes and are oriented substantially perpendicular to the top surface 20 of SOI layer 14. Trenches 30 and 36, which also include sidewalls similar to sidewalls 38, 40 and sidewalls 44, 46, are formed concurrently with trenches 32, 34 using a single mask during the lithography process.

Sidewall 38 is separated from sidewall 40 by a distance, $d_1$, and sidewall 44 is separated from sidewall 46 by a distance, $d_2$. Similarly, the opposite sidewalls of trenches 30 and 36 are separated by a distance, $d_3$. The separation distances, $d_1$, $d_2$, $d_3$, are determined by the line width and pitch of the lithography process or by other sub-lithographic definition processes, such as pitch doubling sidewall image transfer. During the lithography process, a mask or reticle, such as a photomask, having a pattern of transparent and opaque areas is used to permit selective irradiation of the initial patterned resist layer and is tailored to provide the separation distances $d_1$, $d_2$, $d_3$.

Figure 2:
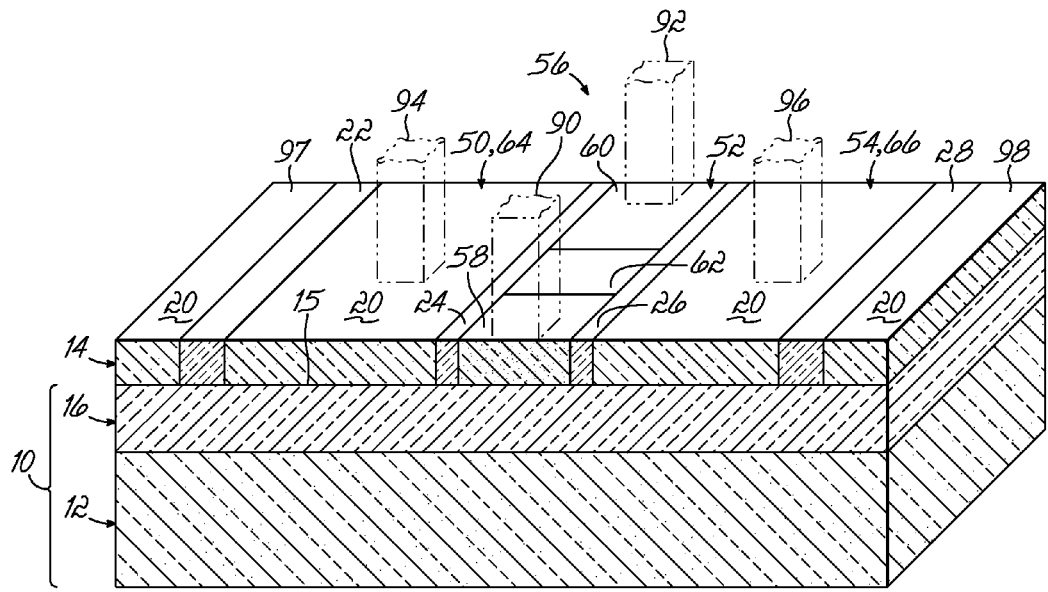
FIG. 2 is a diagrammatic view of the device structure of FIG. 1A at a subsequent fabrication stage.

With reference to FIG. 2 in which like reference numerals refer to like features in FIG. 1A and at a subsequent fabrication stage, the trenches 30, 32, 34, 36 (FIGS. 1A, 1B) are filled with respective portions of a dielectric material and then planarized with a conventional chemical mechanical planarization (CMP) process. Suitable dielectric materials include, but are not limited to, stoichiometric or non-stoichiometric silicon oxide deposited by a CVD process or tetraethylorthosilicate (TEOS) deposited by a low pressure CVD process. An optional high temperature process step may be used to densify a TEOS fill. The pad layer 18 (FIGS. 1A, 1B) is removed by the CMP process to define dielectric regions 24, 26 and isolation regions 22, 28 that partition the SOI layer 14 into active regions 50, 52, 54 supported on the buried insulating layer 16. The dielectric regions 24, 26 and isolation regions 22, 28, which contact the buried dielectric layer 16, are approximately co-planar or flush with the top surface 20 of the active regions 50, 52, 54.

Dielectric region 24 separates active regions 50, 52 of the patterned SOI layer 14 from each other and dielectric region 26 separates active regions 52, 54 from each other. Isolation regions 22 and 28 provide electrical isolation for a device structure, generally indicated by reference numeral 56, formed using active regions 50, 52, 54 and dielectric regions 24, 26, as described below. The width of dielectric region 24 is effectively determined by the separation distance, $d_1$. Similarly, the separation distance, $d_2$, effectively determines the width of dielectric region 26. The separation distance, $d_3$, also effectively defines the width of the isolation regions 22, 28. The widths of the dielectric regions 24, 26 may be adjusted by adjusting the respective separation distances, $d_1$, $d_2$, of trenches 32, 34 during lithography to match a targeted design choice for the device structure 56.

Portions of active region 52 are doped with an impurity that, when activated, is effective to increase the electrical conductivity of the constituent semiconductor material to define a source 58 and a drain 60. The source 58 and drain 60 may be formed by heavily doping the semiconductor material of active region 52 with a p-type impurity, such as boron (B), indium (In), or gallium (Ga). Alternatively, source 58 and drain 60 may be formed by heavily doping the semiconductor material of active region 52 with an n-type impurity, such as arsenic (As), phosphorus (P), or antimony (Sb). The impurity may be introduced into active region 52 by diffusion, ion implantation, or by any other technique for doping semiconductor material with an impurity understood by a person having ordinary skill in the art of device fabrication.

A channel 62 is defined in the semiconductor material of the active region 52 between the source 58 and drain 60. The channel 62 is masked with a block mask during the doping process forming the source 58 and drain 60. The channel 62 is lightly doped either with a concentration of an impurity of the same conductivity type as the source 58 and drain 60 or, alternatively, with a concentration of an impurity of the opposite conductivity type from the source 58 and drain 60. The former doping scheme permits operation of the device structure 56 in a depletion mode in which carriers flow in channel 62 at a null gate voltage. The latter doping scheme permits operation of the device structure 56 in an enhancement mode in which a positive control voltage is required for carrier flow in the channel 62. The doping of the channel 62 may originate from an impurity originally present in the SOI layer 14 at the start of the fabrication process. The channel 62 has a juxtaposed spatial relationship with the source 58 and drain 60 and shares an interface with each.

Active regions 50 and 54 may be heavily doped to define gate electrodes 64, 66. The impurity introduced into the active regions 50 and 54 may have the same conductivity type as the source 58 and drain 60 and, therefore, active regions 50 and 54 may be doped concurrently with the source 58 and drain 60. Alternatively, active regions 50 and 54 may be heavily doped with a concentration of an impurity of the opposite conductivity type from the source 58 and drain 60, which will require the use of additional block masks and multiple doping steps.

Gate electrode 64 is electrically insulated and physically separated from the channel 62 in active region 52 by the dielectric material of the dielectric region 24, which defines a gate dielectric layer. Similarly, gate electrode 66 is electrically insulated and physically separated from the channel 62 in active region 52 by the dielectric material of the dielectric region 26, which defines another gate dielectric layer. Variations in the widths of the respective dielectric regions 24, 26 can adjust the ability of the different gate electrodes 64, 66 to control current flow in the channel 62. The device structure 56 is planar in nature because the gate electrodes 64, 66 and semiconductor body 52 may formed from the SOI layer 14, which at least initially has a uniform thickness.

In an alternative embodiment, the semiconductor material of the active regions 50 and 54 may be replaced either partially or completely by a conductor such as, for example, polysilicon, silicide, metal, or any other material of sufficient electrical conductivity deposited by a CVD process, a physical vapor deposition (PVD) process, or another conventional deposition process. This replacement would occur after the dielectric regions 24, 26 and isolation regions 22, 28 are formed.

During the fabrication process, the device structure 56 is replicated by the CMOS compatible processes across at least a portion of the surface area of the SOI layer 14 of the SOI substrate 10. Standard processing follows, which includes formation of metallic contacts, metallization for the M1 level interconnect wiring, and interlayer dielectric layers, conductive vias, and metallization for upper level (M2-level, M3-level, etc.) interconnect wiring. In particular, metallic contacts 90, 92, 94, 96 are formed to establish respective electrical contacts with the source 58, drain 60, and the gate electrodes 64, 66. In an alternative embodiment, one of the metallic contacts 94, 96 may be omitted such that only one of the gate electrodes 64, 66 is contacted.

Additional device structures (not shown) may be fabricated using at least one of the active regions 97, 98 of the SOI layer 14 that are disposed laterally of the isolation regions 22 and 28, respectively. These device structures may be identical to device structure 56 or may be a different type of device structure, such as a low-voltage logic device. In the latter embodiment, the additional device structures may be fabricated independent of the fabrication process forming device structures like device structure 56, or some process steps may be shared. In any case, isolation regions 22 and 28 electrically isolate the gate electrodes 64, 66 of the device structure 56 from the respective adjacent active regions 97, 98.

The device structure 56 operates by modulating carrier flow through the channel 62 between the source 58 and drain 60, which occurs within the sidewalls of the channel 62 proximate to sidewalls 38 and 40. In operation, the source 58 and drain 60 of the device structure 56 are electrically biased relative to each other by a control voltage applied to one or both of the gate electrodes 64, 66. When the control voltage exceeding a device threshold voltage is applied to one or both of the gate electrodes 64, 66, an electric field is created in the semiconductor material of the channel 62. The transfer of charge carriers across the channel 62 between the source 58 and drain 60 is modulated by varying the strength of the electric field.

Figure 3:
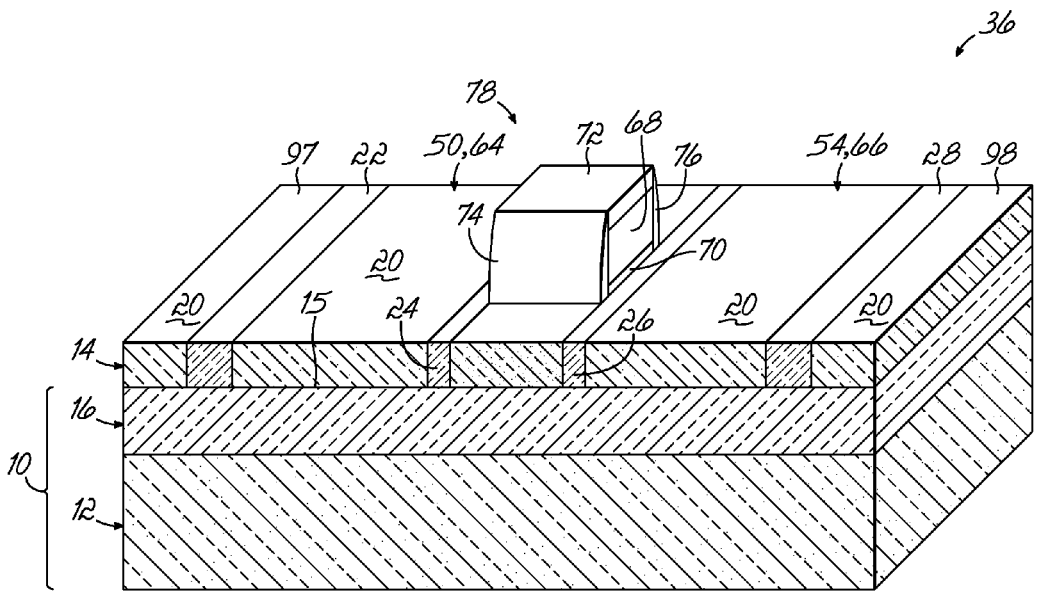
FIG. 3 is a diagrammatic view of a device structure in accordance with an alternative embodiment of the invention.

With reference to FIG. 3 in which like reference numerals refer to like features in FIG. 2 and in accordance with an alternative embodiment, an additional gate electrode 68 may be added to the device structure 56 shown in FIG. 2 to create another device structure 78. The gate electrode 68 is separated from the top surface 20 of active region 52 by a thin gate dielectric layer 70. Candidate dielectric materials for gate dielectric layer 70 include, but are not limited to, silicon oxynitride ($SiO_xN_y$), silicon nitride ($Si_3N_4$), $SiO_2$, and layered stacks of these materials, as well as dielectric materials (e.g., hafnium-based high-k dielectrics) characterized by a relatively high permittivity. The gate electrode 68 may be formed by conventional photolithography and etching process and may be composed of a conductor, such as a metal or doped polycrystalline silicon (i.e., doped polysilicon). Specifically, the gate electrode 68 may be defined by depositing a layer of the conductor, patterning a hard mask that serves as an etch mask for the underlying layer of conductor, and then etching using an anisotropic dry etching process that removes the layer of the conductor and the gate dielectric layer 70 in exposed areas of the patterned hard mask.

After etching, a cap 72 of the hard mask remains on the gate electrode 68. Dielectric spacers 74, 76 are applied to the sidewalls of the gate electrode 68 by a conventional spacer formation process that involves depositing a blanket layer of an insulator or dielectric, such as $Si_3N_4$, $SiO_2$, or a combination of these materials deposited by CVD, followed by etching the blanket layer using a conventional anisotropic dry etching technique, such as RIE, that remove portions of the blanket dielectric layer from substantially horizontal surfaces at a faster rate than from substantially vertical surfaces. The spacers 74, 76 are shown partially removed in FIG. 3 for clarity of illustration to reveal the gate electrode 68 and gate dielectric layer 70. An additional electrical contact (not shown) that is similar to metallic contacts 90, 92, 94, 96 penetrates through the cap 72 to physically contact the gate electrode 68. Consequently, gate electrode 68 may be biased with a control voltage independent of control voltages applied to one or both of gate electrodes 64, 66.

Figure 4:
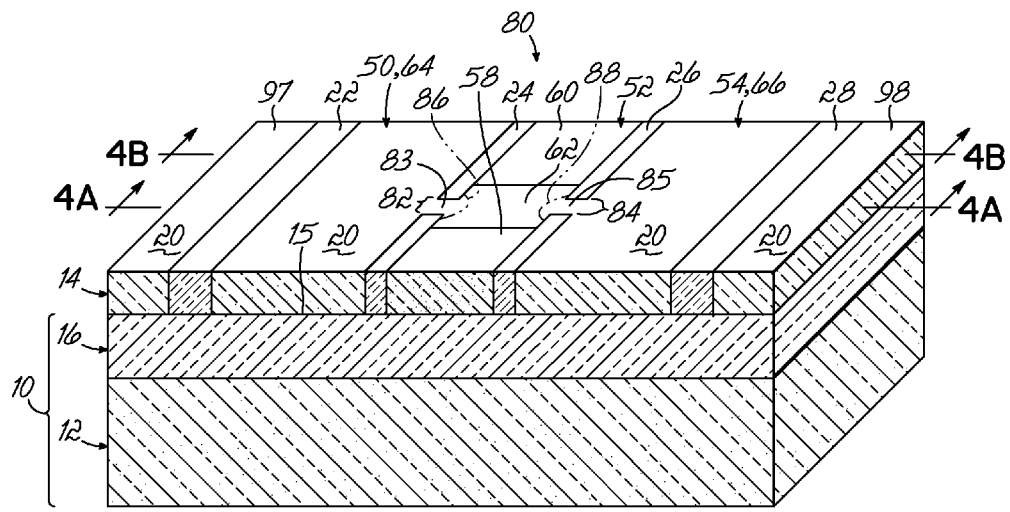
FIG. 4 is a diagrammatic view of a device structure in accordance with an alternative embodiment of the invention.
Figure 4A:
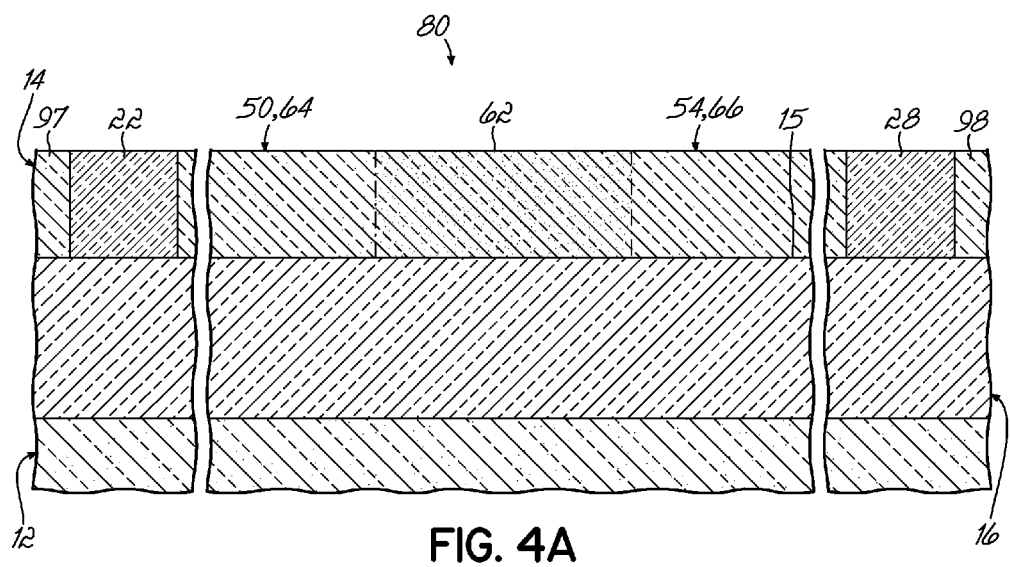
FIG. 4A is a diagrammatic cross-sectional view taken generally along line 4A-4A in FIG. 4.
Figure 4B:
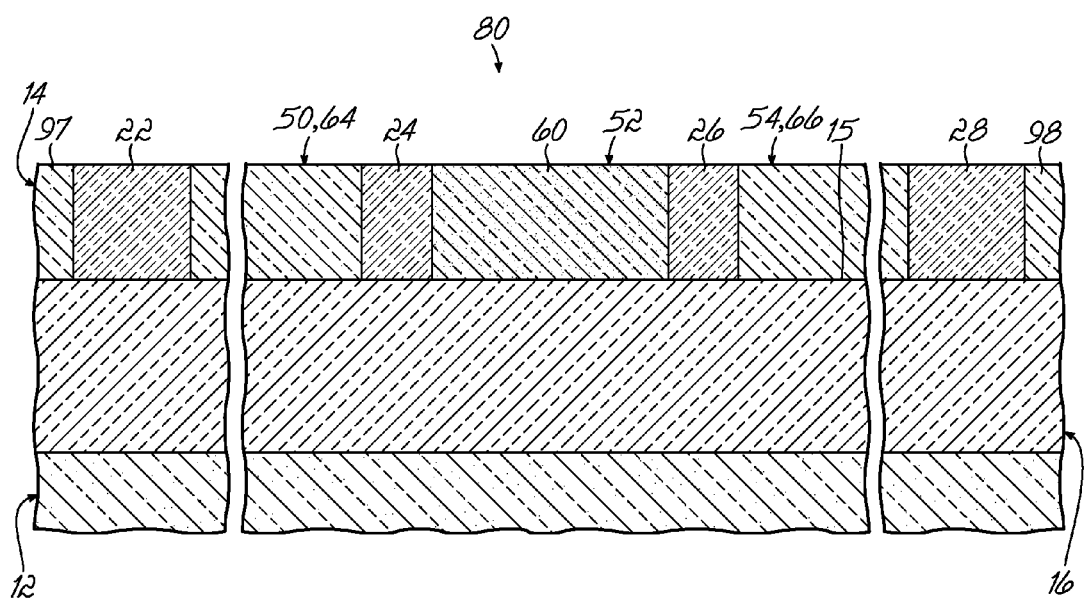
FIG. 4B is a diagrammatic cross-sectional view taken generally along line 4B-4B in FIG. 4.

With reference to FIGS. 4, 4A, and 4B in which like reference numerals refer to like features in FIG. 2 and in accordance with an alternative embodiment, a device structure 80, which is otherwise similar to device structure 56 (FIG. 2), is modified such that the dielectric regions 24, 26 each include a respective discontinuity, which are represented by gaps 82, 84, that extend from the top surface 20 of the SOI layer 14 to the buried insulating layer 16. The gaps 82, 84 are occupied by portions or bridges 83, 85 of the doped semiconductor material of the SOI layer 14. Bridge 83 permits the SOI layer 14 to be continuous between the active regions 50 and 52. Bridge 85 provides continuity of the SOI layer 14 between the active regions 52 and 54. The dielectric regions 24, 26 extend to intersect the buried insulating layer 16 outside of the location of gaps 82, 84, as best shown in FIG. 4B.

The gaps 82, 84 are introduced into the dielectric regions 24, 26 when the trenches 30, 32, 34, 36 (FIG. 1) are defined in the SOI layer 14 using the conventional lithography and dry etching process. The gaps 82, 84 are aligned with the channel 62 in active region 52 and are disposed along the dielectric regions 24, 26 so that the gaps 82, 84 are located relative to the active region 52 between the source 58 and drain 60. The semiconductor material of source 58, drain 60, and channel 62 is doped with a concentration of an impurity of the same conductivity type. The impurity concentration in the source 58 and drain 60 is higher than the dopant concentration in the channel 62. The gate electrodes 64, 66 are doped with a concentration of a dopant of a different conductivity type than the source 58, drain 60, and channel 62.

Interface regions 86, 88, which are illustrated in the representative embodiment as curved surfaces, are disposed in the active region 52 proximate to the gaps 82, 84. The interface regions 86, 88 arise because of the different conductivity types of the impurities doping the channel 62 and gate electrodes 64, 66 and the presence of the gaps 82, 84 in the dielectric regions 24, 26. The interface regions 86, 88 extend in the SOI layer 14 from the top surface 20 of the SOI layer 14 to intersect the buried insulating layer 16, as best shown in FIG. 4A. The interface regions 86, 88 represent transition zones across which the net conductivity type of the dopant transitions from the impurity having the conductivity type of the channel 62 to the opposite conductivity type of the impurity present in the respective one of the gate electrodes 64, 66.

Figure 5:
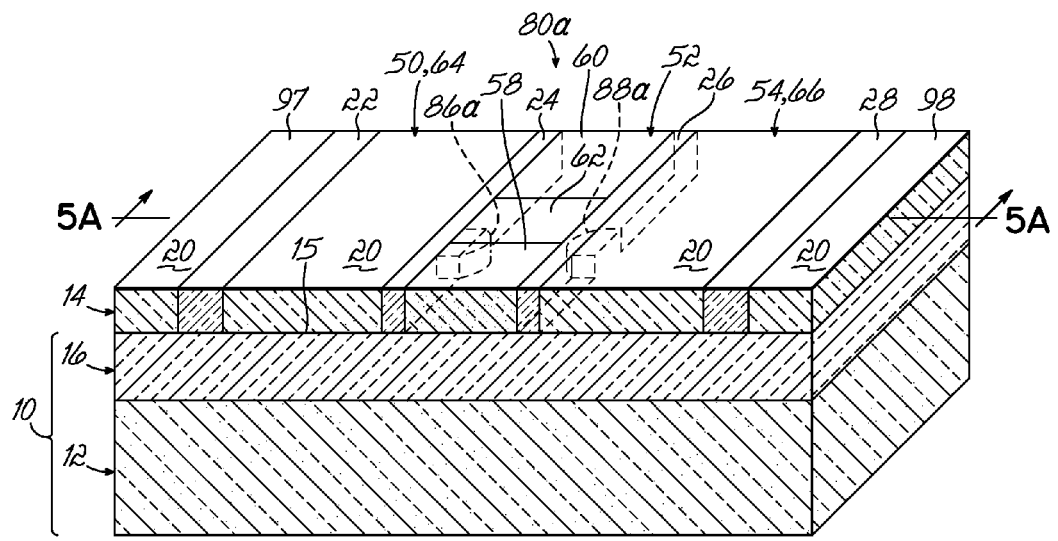
FIG. 5 is a diagrammatic view of a device structure in accordance with an alternative embodiment of the invention.
Figure 5A:
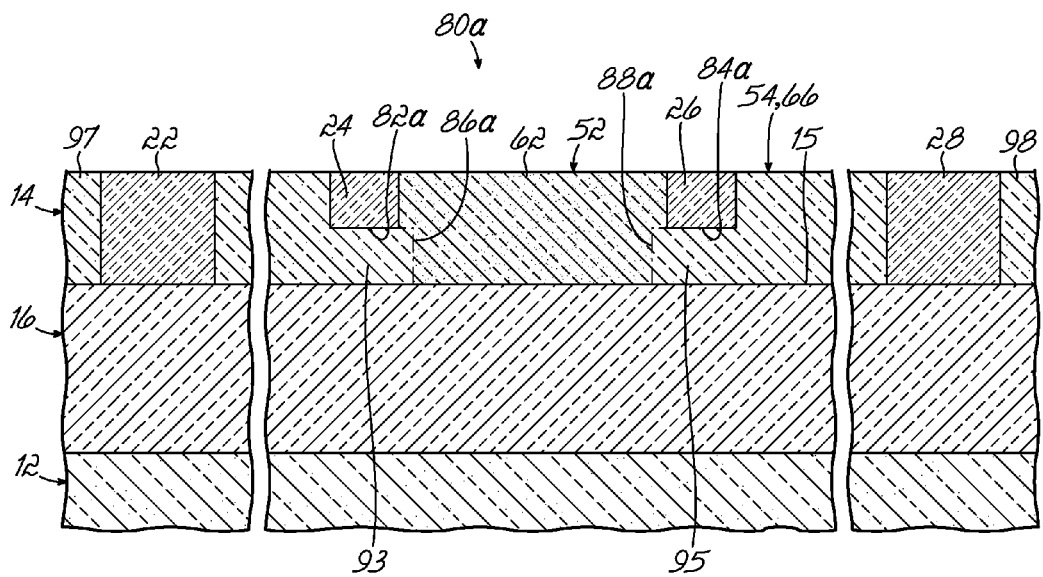
FIG. 5A is a diagrammatic cross-sectional view taken generally along line 5A-5A in FIG. 5.

With reference to FIGS. 5 and 5A in which like reference numerals refer to like features in FIGS. 4, 4A, and 4B and in accordance with an alternative embodiment, a device structure 80a, which is otherwise similar to device structure 80 (FIGS. 4, 4A, 4B), is modified with discontinuities represented by apertures 82a, 84a extending respectively through the dielectric regions 24, 26. Portions 93, 95 of the doped semiconductor material of the SOI layer 14 are respectively disposed in the apertures 82a, 84a between the dielectric material of the dielectric regions 24, 26 and the constituent dielectric material of the buried insulating layer 16. Portion 93 defines a bridge of the doped semiconductor material of SOI layer 14 that connects the active regions 50 and 52. Portion 95 defines a bridge of the doped semiconductor material of SOI layer 14 that connects the active regions 52 and 54.

In this embodiment, the sidewalls 38, 40 and sidewalls 44, 46 do not extend to the buried insulating layer 14 at the locations of the apertures 82a, 84a, as best reflected in FIG. 5A, but do extend to intersect the buried insulating layer 16 outside of the location of apertures 82a, 84a. The bridge zones 82a, 84a are defined when the trenches 32, 34 are etched in the SOI layer 14. Interface regions 86a, 88a, which are similar to interface regions 86, 88 (FIGS. 4, 4A), are defined in the doped semiconductor material of the SOI layer 14 because of the presence of the apertures 82a, 84a.

Figure 6:
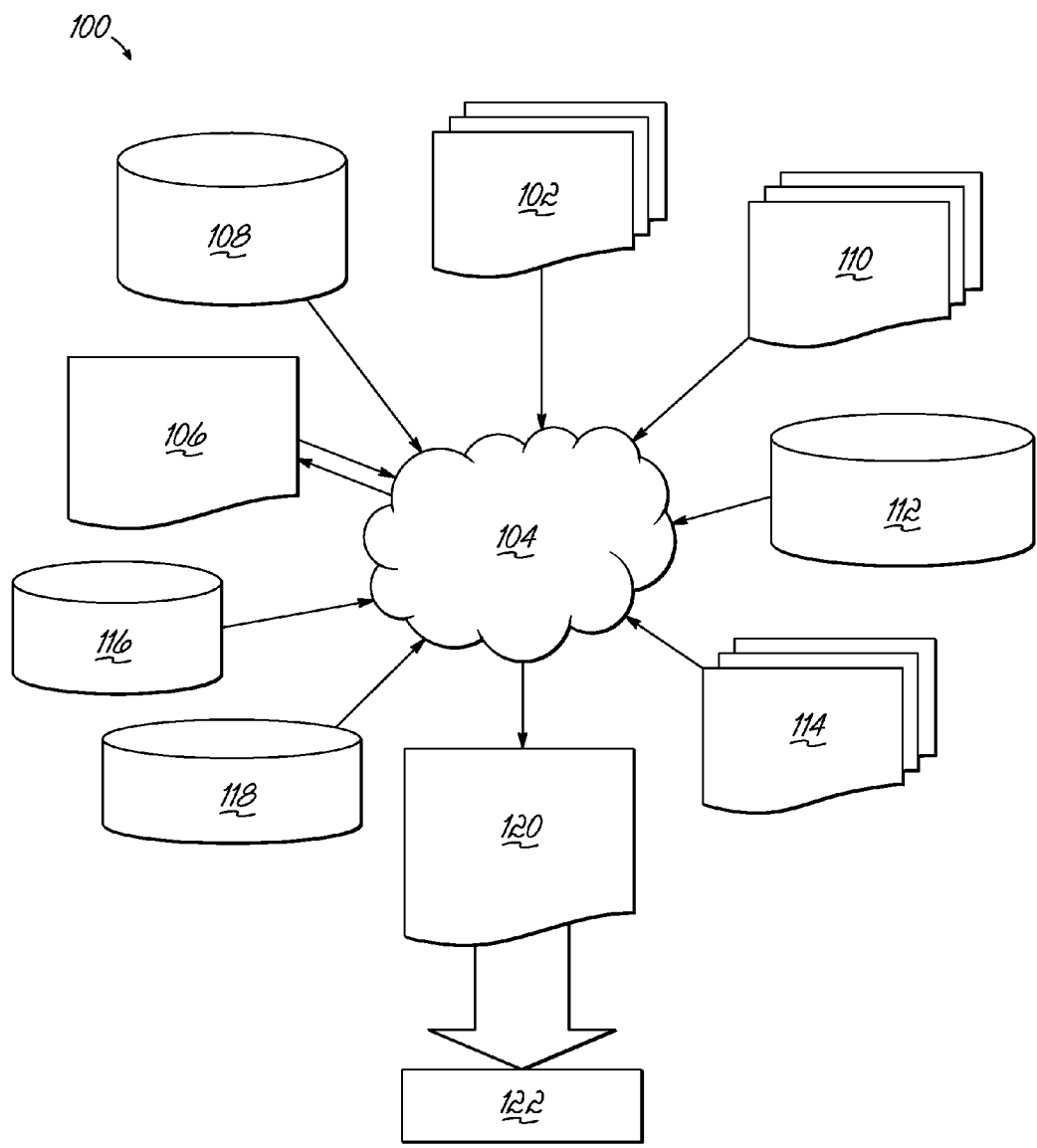
FIG. 6 is a flow diagram of a design process used in semiconductor design, manufacture, and/or test.

FIG. 6 shows a block diagram of an exemplary design flow 100 used for example, in semiconductor design, manufacturing, and/or test. Design flow 100 may vary depending on the type of IC being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA) offered by Altera® Inc. or Xilinx® Inc. Design structure 102 is preferably an input to a design process 104 and may come from an IP provider, a core developer, or other design company or may be generated by the operator of the design flow, or from other sources. Design structure 102 comprises an embodiment of the invention as shown in FIG. 2, FIG. 3, FIGS. 4,4A,4B, or FIGS. 5,5A,5B in the form of schematics or HDL, a hardware-description language (e.g., Verilog, VHDL, C, etc.). Design structure 102 may be contained on one or more machine readable medium. For example, design structure 102 may be a text file or a graphical representation of an embodiment of the invention as shown in FIG. 2, FIG. 3, FIGS. 4,4A,4B, or FIGS. 5,5A,5B. Design process 104 preferably synthesizes (or translates) an embodiment of the invention as shown in FIG. 2, FIG. 3, FIGS. 4,4A,4B, or FIGS. 5,5A,5B into a netlist 106, where netlist 106 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 106 is resynthesized one or more times depending on design specifications and parameters for the circuit.

Design process 104 may include using a variety of inputs; for example, inputs from library elements 108 which may house a set of commonly used elements, circuits, and devices, including models, layouts, and symbolic representations, for a given manufacturing technology (e.g., different technology nodes, 32 nm, 45 nm, 90 nm, etc.), design specifications 110, characterization data 112, verification data 114, design rules 116, and test data files 118 (which may include test patterns and other testing information). Design process 104 may further include, for example, standard circuit design processes such as timing analysis, verification, design rule checking, place and route operations, etc. One of ordinary skill in the art of integrated circuit design can appreciate the extent of possible electronic design automation tools and applications used in design process 104 without deviating from the scope and spirit of the invention. The design structure of the invention is not limited to any specific design flow.

Design process 104 preferably translates an embodiment of the invention as shown in FIG. 2, FIG. 3, FIGS. 4,4A,4B, or FIGS. 5,5A,5B, along with any additional integrated circuit design or data (if applicable), into a second design structure 120. Design structure 120 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 120 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 2, FIG. 3, FIGS. 4,4A,4B, or FIGS. 5,5A,5B. Design structure 120 may then proceed to a stage 122 where, for example, design structure 120 proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A design structure embodied in a non-transient machine readable medium for designing, manufacturing, or testing an integrated circuit, the design structure comprising:
   a first gate electrode;
   a second gate electrode,
   a semiconductor body including a source, a drain, and a channel between the source and the drain, the semiconductor body positioned laterally on the insulating layer between the first gate electrode and the second gate electrode;
   a first gate dielectric layer disposed between the semiconductor body and the first gate electrode; and
   a second gate dielectric layer disposed between the semiconductor body and the second gate electrode, the second gate dielectric layer in contact with the semiconductor body;
   wherein the semiconductor body, the first gate electrode, the second gate electrode, the first gate dielectric layer, and the second gate dielectric layer each have a contacting relationship with the insulating layer.

2. The design structure of claim 1 wherein the design structure comprises a netlist.

3. The design structure of claim 1 wherein the design structure resides on storage medium as a data format used for the exchange of layout data of integrated circuits.

4. The design structure of claim 1 wherein the design structure resides in a programmable gate array.

5. The design structure of claim 1 wherein the semiconductor body contains a monocrystalline semiconductor material composed primarily of silicon, the channel of the semiconductor body is doped with a first impurity having an first conductivity type, and the source and the drain of the semiconductor body are doped with a second impurity having an second conductivity type opposite to the first conductivity type.

6. The design structure of claim 5 wherein the first gate electrode and the second gate electrode each contain the monocrystalline semiconductor material doped with a concentration of the first impurity or a concentration of the second impurity.

7. The design structure of claim 1 wherein the semiconductor body, the first gate electrode, and the second gate electrode each contain a monocrystalline semiconductor material composed primarily of silicon, the channel, the source, and the drain of the semiconductor body are doped with a first impurity having an first conductivity type, and the first gate electrode and the second gate electrode of the semiconductor body are doped with a second impurity having an second conductivity type opposite to the first conductivity type.

8. The design structure of claim 7 further comprising:
   a first portion of the monocrystalline semiconductor material extending through the first gate dielectric layer to connect the semiconductor body and the first gate electrode; and
   a second portion of the monocrystalline semiconductor material extending through the second gate dielectric layer to connect the semiconductor body and the second gate electrode.

9. The design structure of claim 7 further comprising:
   a first transition zone in the monocrystalline semiconductor material of the semiconductor body across which a net conductivity changes from the first conductivity type of the semiconductor body to the second conductivity type of the first gate electrode; and
   a second transition zone in the monocrystalline semiconductor material of the semiconductor body across which the net conductivity changes from the first conductivity type of the semiconductor body to the second conductivity type of the second gate electrode.

10. The design structure of claim 1 wherein the first gate electrode, the second gate electrode, and the semiconductor body contain a monocrystalline semiconductor material composed primarily of silicon, and the first gate dielectric layer and the second gate dielectric layer are composed of silicon dioxide.

11. The design structure of claim 1 further comprising:
   a third gate dielectric layer disposed between the first gate electrode and another semiconductor body adjacent to the first gate electrode, the third gate dielectric layer having the contacting relationship with the insulating layer.

12. The design structure of claim 1 further comprising:
   a third gate electrode positioned relative to the semiconductor body such that the channel of the semiconductor body is between the third gate electrode and the insulating layer; and
   a third gate dielectric layer disposed between the third gate electrode and the second gate electrode.

13. The design structure of claim 1 wherein the semiconductor body, the first gate electrode, and the second gate electrode are adjacent portions of a semiconductor layer carried on the insulating layer, the first gate dielectric layer is formed in a first trench extending from a top surface of the semiconductor layer to the insulating layer, and the second gate dielectric layer is formed in a second trench extending from the top surface of the semiconductor layer to the insulating layer.

14. The design structure of claim 1 wherein the first gate dielectric layer and the second gate dielectric layer have different widths.

* * * * *